(12) United States Patent
Ledden

(10) Patent No.: US 6,975,114 B1
(45) Date of Patent: Dec. 13, 2005

(54) METHODS FOR TRANSMIT EXCITATION IN MAGNETIC RESONANCE IMAGING USING A TRANSMIT PULSE WITH TIME VARYING SPATIAL CHARACTERISTICS

(75) Inventor: Patrick J. Ledden, Wakefield, MA (US)

(73) Assignee: Nova Medical, Inc., Wilmington, MA (US)

( * ) Notice: Subject to any disclaimer, the term of this patent is extended or adjusted under 35 U.S.C. 154(b) by 0 days.

(21) Appl. No.: 10/719,562

(22) Filed: Nov. 20, 2003

Related U.S. Application Data

(60) Provisional application No. 60/427,864, filed on Nov. 20, 2002.

(51) Int. Cl.[7] .............................................. G01V 3/00
(52) U.S. Cl. ...................... 324/314; 324/312
(58) Field of Search ................ 324/314, 312, 324/309, 307, 306

(56) References Cited

U.S. PATENT DOCUMENTS 4,613,949 A * 9/1986 Glover et al. ............... 324/307
4,672,319 A * 6/1987 Nishimura .................. 324/309
4,710,718 A * 12/1987 Shaka ........................ 324/309

* cited by examiner

Primary Examiner—Louis Arana
(74) Attorney, Agent, or Firm—Altman & Martin

(57) ABSTRACT

A method of inducing spin excitation by employing RF transmission fields of time-varying spatial characteristics in order to better control the overall distribution of spin excitation. The MRI transmit inductor system generates an RF transmission of particular spatial characteristics, followed by one or more additional RF transmissions with different spatial characteristics, where the additional RF transmissions alter the spin excitation produced by the first RF transmission. The spin excitation can be provided by a sequence of two or more discrete RF transmissions with different spatial characteristics, by a single RF transmission that has continuously varying spatial characteristics, by using successive RF transmissions of the primary and higher order modes of a volume coil, and/or by an RF transmission from a volume or surface coil followed by a second RF transmission from one or more local surface coils.

11 Claims, 8 Drawing Sheets

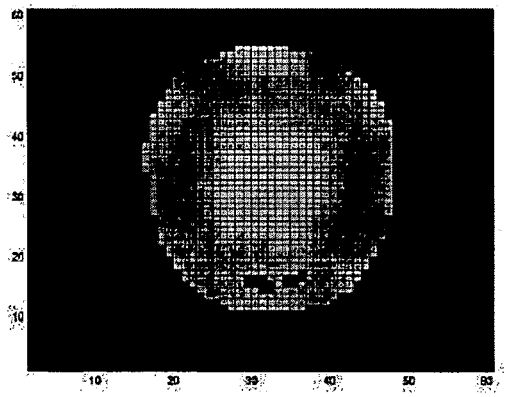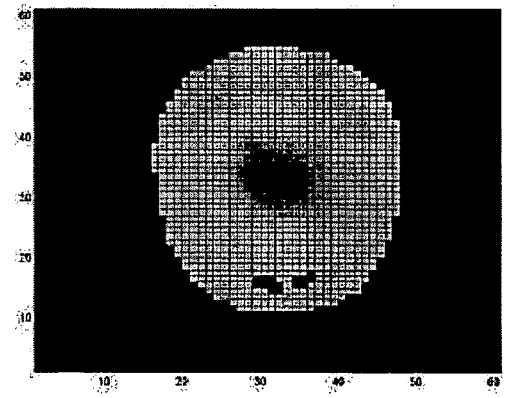
FIG. 11A  FIG. 11B
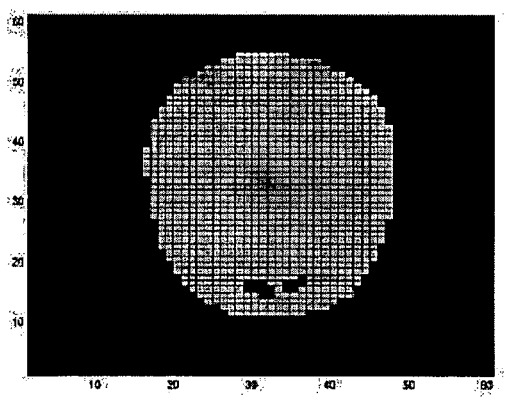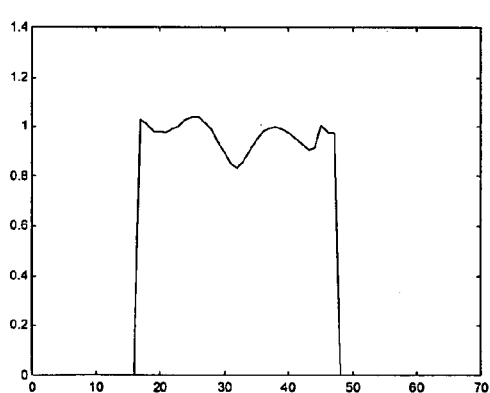
FIG. 11C  FIG. 11D

METHODS FOR TRANSMIT EXCITATION IN MAGNETIC RESONANCE IMAGING USING A TRANSMIT PULSE WITH TIME VARYING SPATIAL CHARACTERISTICS

CROSS-REFERENCES TO RELATED APPLICATIONS

The applicant wishes to claim the benefit of U.S. Provisional Patent Application No. 60/427,864, dated Nov. 20, 2002, for METHOD FOR IMPROVED TRANSMIT EXCITATION HOMOGENEITY FOR MAGNETIC RESONANCE IMAGING SCANNER USING A TRANSMIT PULSE WITH A TIME VARYING SPATIAL CHARACTERISTIC in the name of Patrick J. Ledden.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to magnetic resonance imaging systems, more particularly, to methods for improving transmit spin excitation.

2. Description of the Related Art

Magnetic Resonance Imaging (MRI) has proven to be an enormously useful technology both for the detection and diagnosis of human disease as well as for research into the understanding of basic human and animal physiology.

For the acquisition of image data from a nuclear magnetic resonance (NMR) signal, four separate components are required, as shown in FIG. 1. First, a static magnetic field must be generated by a constant field magnet 12, generally of the superconducting type. Pursuant to quantum mechanics, the presence of the static magnetic field causes in a subject an energy difference between nuclear spins aligned with and against this static magnetic field. The magnitude of the energy difference depends on a variety of factors, including strength of the magnetic field, size of the magnetic moments of individual atomic nuclei, and temperature. In general, a majority of the nuclear spins will align with the static magnetic field and a higher energy minority of the nuclear spins will align against it. When exposed to an oscillating magnetic field of proper frequency, such as is generated by an alternating current in a radio frequency (RF) transmit coil structure 14, some of the lower energy spins aligned with the static magnetic field will be excited to the higher energy state of being aligned against the field. Once the applied transmit RF magnetic field is removed, these excited spins will decay to the lower energy state of alignment with the static magnetic field. During the decay, these spins will generate their own RF magnetic field, which can be electronically detected by the same or a different RF coil structure 16 and thereby be characterized. In order to determine spatial information about the quantity and properties of the atomic nuclei of the subject, a second set of gradient coils 18 are used to perturb the static magnetic field. By generating magnetic field gradients, current in this separate set of coils 18 spatially changes the oscillation frequency of the nuclear spins by changing the frequency of the nuclear magnetic resonance (NMR) oscillation at appropriate times during transmit and receive, and spatial information regarding the nuclear spins can be decoded and converted into an image. The generation of the NMR signal in the transmit coil structure 14, the reception of the NMR signal by the receive coil structure 16, and the currents in the gradient coils are controlled by a computer system 20 which processes the information obtained and displays it on a computer screen or printed film for human interpretation.

Current technology high frequency volume coils for magnetic resonance imaging (MRI) brain and body imaging have RF magnetic field inhomogeneities caused by wavelength effects (or "dielectric resonance") and conductive shielding effects inside human tissue. For image reception, these field inhomogeneities are of less concern as they can be adjusted by spatially correcting the image intensity variations caused by the inhomogeneous reception fields after image processing. However, inhomogeneities in the transmit field cause non-uniform spin excitation which leads to significant reductions in signal-to-noise ratio (SNR) and image contrast. These effects can be seen at 3 Tesla (T) field strengths for human brain and body imaging and become pronounced at 4 T and higher field strengths.

Transmit systems such as described in U.S. Pat. No. 6,501,274 attempt to correct the field distortions caused by dielectric wave effects by independently controlling individual elements in a volume coil, that is, by controlling the spatial magnetic field profile (which does not change either during a given spin excitation or between successive spin excitations). While this can result in improvement in transmit field homogeneity, Maxwell's equations limit the achievable reduction in inhomogeneities because field patterns that correct for inhomogeneities in one area worsen the inhomogeneities in other areas. At high frequencies, a homogeneous magnetic field is not a solution to Maxwell's equation in a dielectric body.

Examples of field inhomogeneities are shown in FIGS. 2 and 3, which show magnetic field profiles from an eight element volume coil driven with quadrature excitation at 128 MHz (3 T) and 300 MHz (7 T), respectively, using a finite difference, time domain (FDTD) method calculation with a 5 mm head/body mesh. The images are of an axial field slice through the mid portion of a human brain. As is typically found at ultrahigh frequencies, fields from a volume coil are more intense at the brain center than at the edges. In particular, there is a region in the parietal and temporal lobes which has particularly low field intensity.

BRIEF SUMMARY OF THE INVENTION

An object of the present invention is to provide methods for inducing a spin excitation distribution in an object that is undergoing magnetic resonance imaging that is closer to the desired spin excitation distribution than the methods of the prior art.

The method of the present invention employs a transmit excitation with an RF field of time varying spatial characteristics in order to improve the overall distribution of spin excitation. The present invention can be adapted to all pulse sequences. In one configuration, the MRI transmit inductor system generates an RF transmission of particular spatial characteristics which is followed by a second RF transmission with different spatial characteristics. The second RF transmission alters the spin excitation produced by the first RF transmission. The second RF transmission may be followed by one or more additional RF transmissions to further refine the spin excitation. The second RF transmission should occur before the spins induced by the first RF transmission have a chance to relax.

Several embodiments of the basic method are contemplated by the present invention. The first provides spin excitation using a sequence of two or more discrete RF transmissions with different spatial characteristics. Where it is not convenient to optimize both RF transmissions, the second RF transmission alone may be optimized to correct or compensate for the known inhomogeneities in the first. The second method provides spin excitation with a single transmission that has continuously varying spatial characteristics. The third method provides spin excitation using successive transmissions via the primary and higher order modes of a volume coil. In the fourth method, excitation is provided with a volume or surface coil followed by separate excitation with one or more local surface coils.

Other objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein:

FIGS. 11A and 11B show images of the magnetic field distributions for the first and second RF transmissions, respectively, where only the second transmission is optimized for all coil elements;

FIGS. 11C and 11D show an image and a line plot, respectively, of the combination of the excitation profiles from the first and second RF transmissions of FIGS. 11A and 11B;

DETAILED DESCRIPTION OF THE INVENTION

Figure 1:
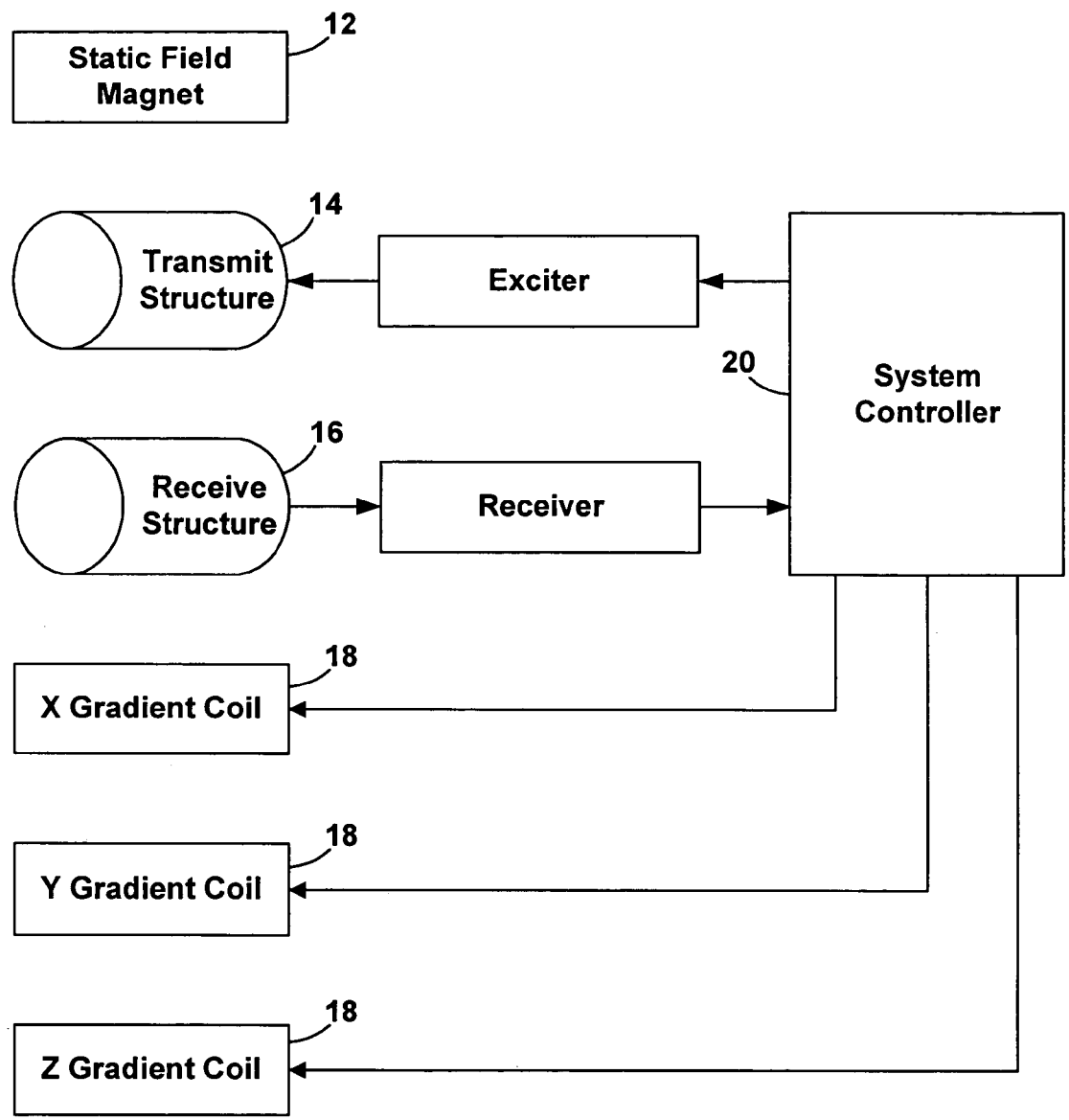
FIG. 1 is a basic block diagram of an MRI system that can be used to implement the methods of the present invention.
Figure 2A:
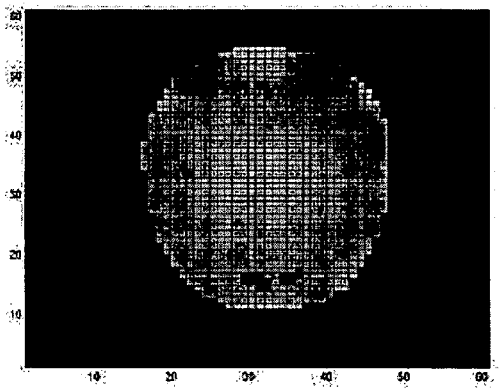
FIGS. 2A and 2B are a prior art image and a line plot, respectively, of the magnetic field in an axial slice through the mid portion of a human brain using an eight-element volume resonator driven with quadrature excitation at 128 MHz (equivalent to proton imaging at 3 T)
Figure 2B:
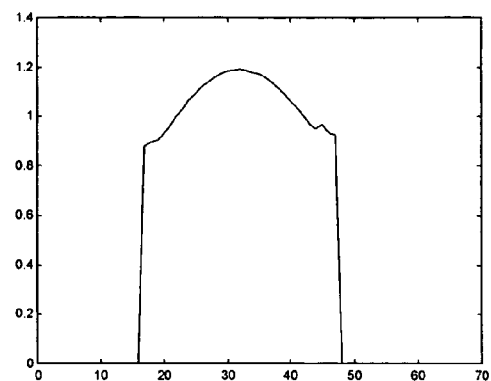
Figure 3A:
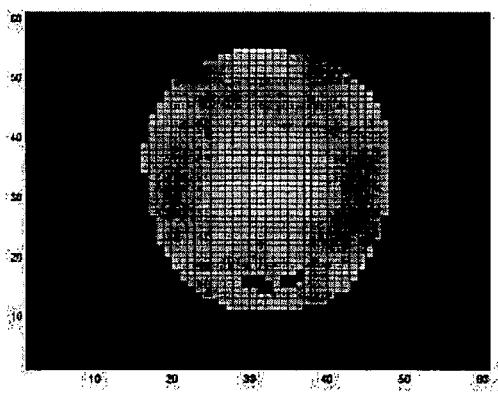
FIGS. 3A and 3B are a prior art image and a line plot, respectively, of the magnetic field in an axial slice through the mid portion of a human brain using an eight-element volume resonator driven with quadrature excitation at 300 MHz (equivalent to proton imaging at 7 T)
Figure 3B:
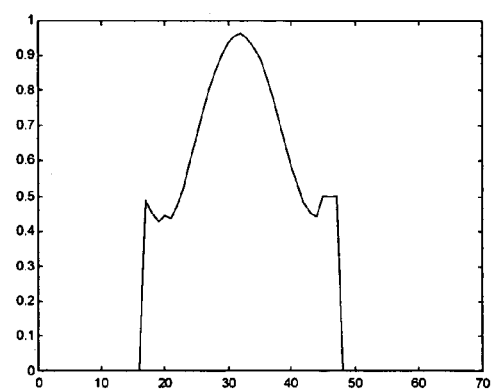

It has been discovered that if the spatial characteristics of the RF transmit field change either during a given excitation or between successive excitations, a much broader range of overall spin excitation characteristics can be achieved. In particular, because multiple excitations over a short time frame (e.g., microseconds to milliseconds) can have additive effects, a first excitation followed by one or more subsequent excitations with different spatial characteristics can result in a much more uniform overall spin excitation than a single unvarying excitation alone. If a single excitation is divided into two temporally spaced shorter transmissions, the first with one geometry of specified currents to create an excitation field of a specific spatial distribution and the second with a different geometry of specified currents to create a different spatial distribution of the excitation field, a net spin excitation results that under proper circumstances (e.g., closely spaced temporal emissions) is close to the sum of the individual excitations. Since the field profile of the second excitation can have a very different spatial distribution than that of the first excitation, it is possible for the second excitation to compensate for the inhomogeneities of the first.

It is important to note that simultaneous excitation of both a higher order mode and a uniform mode of a volume coil creates local areas of field cancellation that create large variations in the field profile. By separating these excitation modes in time, additive effects are caused on the spin excitation without causing the field cancellation that occurs with simultaneous excitation with these field patterns.

Mathematically, with separate RF transmissions of different spatial characteristics, the net spin excitation arises from the scalar sum of the field magnitudes compared with the vector sum if the fields are applied simultaneously. Hence, two separate transmit pulses or a single pulse with time varying spatial characteristics can provide a net spin excitation profile which would be unachievable by a pulse of single spatial distribution.

The method of the present invention employs a combined spatially varying and temporally varying RF transmission field in order to improve the overall distribution of spin excitation.

Because of the unique nature of the present invention, some terminology must be clarified and defined. In the art, a pulse sequence is the overall sequence of RF spin excitations, gradient waveforms, and data acquisition periods that occurs to provide a complete image of the subject. A spin excitation is induced by an RF transmission field used to excite spins prior to data acquisition. In devices of the prior art, the transmission field has spatial characteristics which do not change, consistent with Maxwell's equations, either during a given spin excitation or between excitations. In the present invention, however, a spin excitation can be induced by a single RF transmission with time varying spatially characteristics, or by two or more temporally spaced RF transmissions with different spatial characteristics, neither of which is the case in the prior art.

All objects have at least two intrinsic relaxation time constants: the longitudinal relaxation time constant (T1) and the transverse relaxation time constant (T2). The longitudinal relaxation time refers to the return of longitudinal magnetization to equilibrium after excitation. The transverse relaxation time refers to the decay of the transverse magnetization to zero due to a loss of phase coherence among the spins. The transverse relaxation time constant is always less than the longitudinal relaxation time constant, but for the purposes of this specification, both will be called intrinsic relaxation time constants. Other relaxation processes exist due to extrinsic factors, including inhomogeneities in the static magnetic field, and are not considered intrinsic relaxation time constants for the purposes of this specification.

In one configuration of the present invention, a transmit inductor system, in the form of a "birdcage", "transmission line structure," or other conductor structure, is used to generate an RF transmission of particular spatial characteristics. This is followed by a second RF transmission with different spatial characteristics to alter the spin excitation produced by the first RF transmission. The second RF transmission may be followed by one or more additional RF transmissions to further refine the spin excitation. In particular, additional RF transmissions can provide a net spin excitation that is more homogeneous than that of a single RF transmission with unvarying spatial characteristics. These additional RF transmissions may either be from a different mode or drive pattern on the same volume coil or, alternately, a separate conductor arrangement in the form of another volume coil or one or more local surface coils. When using separate coils, the source of the additional transmissions must be actively detuned during the first transmission, and the source of the first transmission must be detuned during the additional transmissions. This detuning is optimally done with PIN diodes, which allow tuning or detuning of a resonant structure with a change in a DC bias voltage. This transmission arrangement can be used with linear or quadrature type RF transmission fields. To reduce power requirements and improve basic RF homogeneity, the first transmission field is preferably of the quadrature variety, while the subsequent transmissions can be either linear or quadrature.

The present method, in addition to providing improved uniformity of spin excitation, requires less RF power. Since there is a homogenous excitation of spins, no excess power is required for over-flipping spins in some areas while under-flipping them in others. Also, on average, tissue-absorbed power and heating are less as areas of high field intensity do not cause excessive tissue heating and the lower required RF power reduces total tissue exposure to RF fields.

Unlike conventional coils used in NMR and MRI, the present invention requires a system that has more control over the operation of the transmit inductor system than typical MRI systems of the prior art. This is because the state of the transmit inductor system (e.g., first RF transmission, second RF transmission, etc.) must be appropriately timed with the waveform applied to the RF power amplifiers and the rest of the scanner. In most commercial systems, appropriate programming must be performed to provide additional RF transmissions in the overall image acquisition sequence (including gradient waveforms and data acquisition periods) and to ensure that appropriate control signals are provided to the transmit inductor system to ensure that it operates correctly during spin excitation and, in particular, provides RF transmissions of the proper spatial characteristics.

In operation, the present invention employs two or more temporally spaced RF transmissions, each being of an appropriate amplitude and duration with a given spatially distributed field profile, to induce a net spin excitation of a given amplitude and distribution which can be more homogeneous than a single conventional RF transmission. Before starting an imaging sequence, the system controller sets the amplitude and duration of each of the RF transmissions, typically by cycling through a set of RF transmissions with different amplitudes and distributions until a combination is found that will create a spin excitation of desired characteristics.

By having a variable drive transmit system, that is, one in which a volume coil can be driven at multiple locations at with continuously time variable amplitudes and phases, a more elaborate procedure will generally be needed to flatten the transmission field for a given subject. Such a system can have an infinite number of different spatial characteristics, but only a subset of combinations which will give desired results. A multivariable optimization or search method is required to find a set of suitable RF transmission parameters. In general, this search will require mapping of the RF transmit fields produced by the transmit system and adjustment of the parameters to provide a net excitation of close to the desired spin excitation distribution and amplitude.

Figure 4:
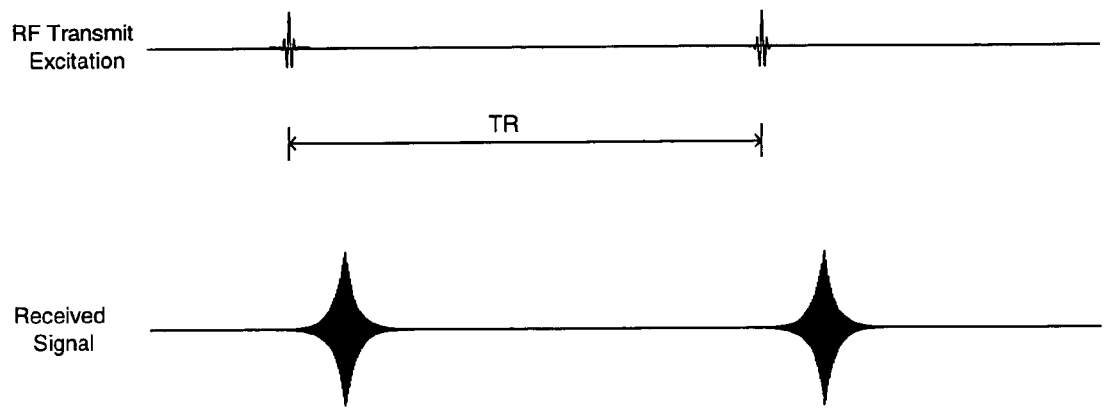
FIG. 4 is a graphical representation of a conventional prior art gradient echo pulse sequence with the gradient waveforms omitted for clarity.
Figure 5:
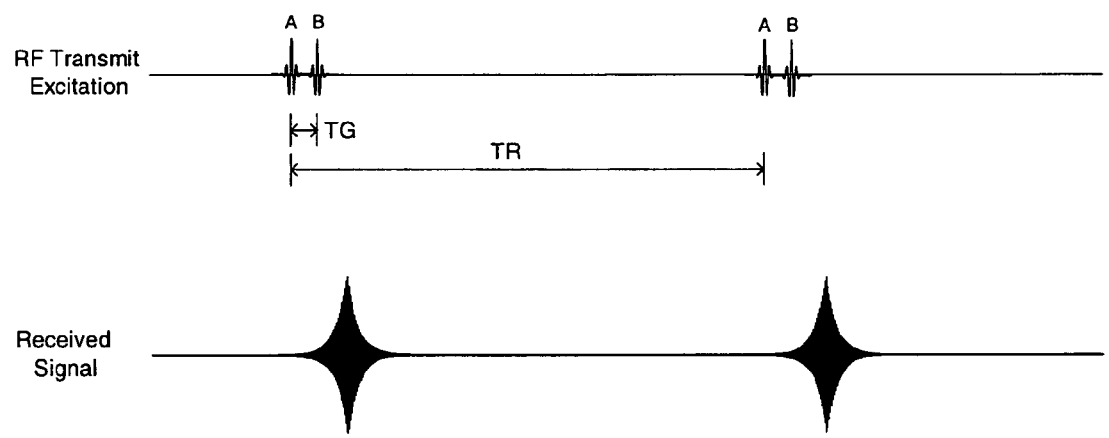
FIG. 5 is a graphical representation of a gradient echo pulse sequence employing the present invention with the gradient waveforms omitted for clarity.

FIG. 4 shows a basic gradient echo pulse of the prior art and FIG. 5 shows a basic gradient echo pulse employing the present invention. The two RF transmissions A and B of the spin excitation of FIG. 5 have different spatial characteristics and the second RF transmission should be initiated before the spins induced by the first RF transmission have a chance to relax. In other words, the time between the two RF transmissions, TG, should be no greater than the longest intrinsic relaxation time constant of the system. The characteristics of the individual RF transmissions are chosen to create a net spin excitation of a desired distribution and amplitude.

Figure 6:
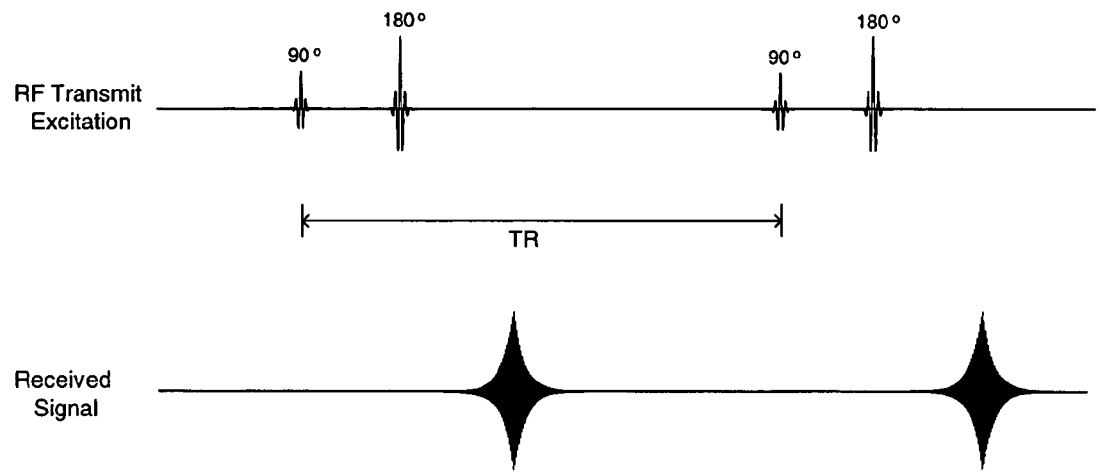
FIG. 6 is a graphical representation of a conventional prior art spin echo pulse sequence with the gradient waveforms omitted for clarity.
Figure 7:
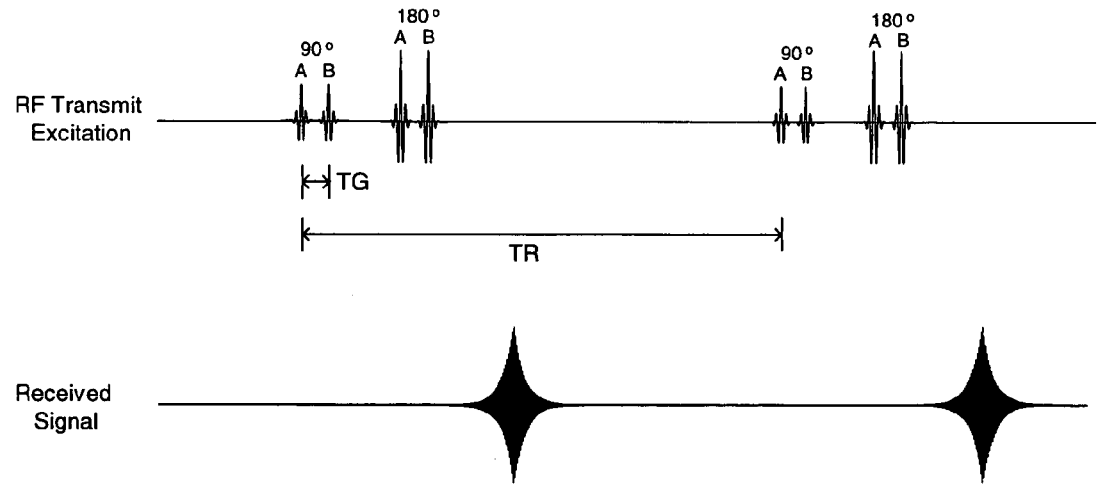
FIG. 7 is a graphical representation of a spin echo pulse sequence employing the present invention with the gradient waveforms omitted for clarity.

FIG. 6 shows a basic spin echo pulse set of the prior art and FIG. 7 shows a basic spin echo pulse set employing the present invention. As with the sequence of FIG. 5, the two RF transmissions A and B of the spin excitation of FIG. 7 have different spatial characteristics and the second RF transmission should be initiated before the spins relax. In other words, the time between the two RF transmissions, TG, should be no greater than the longest intrinsic relaxation time constant of the system. The characteristics of the individual RF transmissions are chosen to create a net spin excitation of a desired distribution and amplitude.

The present invention can be adapted to all pulse sequences, including, but not limited to, fast spin echo, gradient-recalled acquisition in the steady state (GRAS), magnetization-prepared rapid acquisition gradient echo (MPRAGE), fast imaging with steady-state precession (FISP), etc.

It should be mentioned that for some applications, such as fat suppression, use of only a subset of different RF transmission characteristics may be acceptable. In other words, for suppression of a fat signal from the skin and superficial adipose tissue, use of a higher order volume coil mode or transmission with a surface coil (or array thereof) uses less power than the uniform mode of a volume coil and thereby reduces overall power requirements and tissue specific absorption rate (SAR).

It is also contemplated that under certain circumstances (e.g., for transmit SENSE), it may be desired to create a specifically non-uniform spin excitation. The use of a transmit field with time-varying spatial characteristics such as that described herein permits a much greater range of field profiles than can be achieved with a conventional transmit excitation of fixed spatial profile.

1. Comparison Baseline

In order to compare the method of the present invention to earlier methods, a series of simulations was performed with a full wave field solving program (xFDTD from Remcom, Inc.) which includes a precise electrical model of a human head and torso. While the present invention is not limited to a specific coil design, frequency, body part, or pulse sequence, for illustration purposes computations were run with a transmission line, shielded volume coil of the type described in U.S. Pat. No. 6,501,274. For the simulation, the coil had eight, independently driven, 20 cm long elements arranged on a bolt circle of 28 cm. The outside shield had an inside diameter of 36 cm and included an end cap at the top of the head to reduce radiation losses.

Figure 8A:
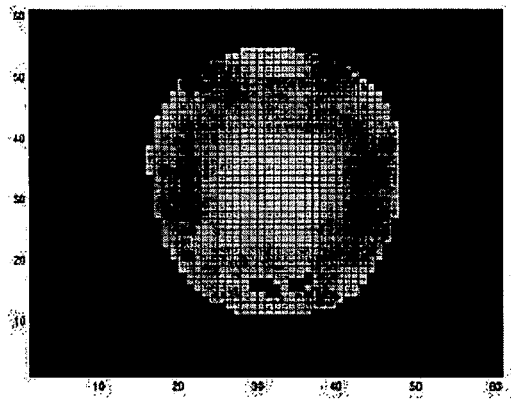
FIGS. 8A and 8B show a prior art image and a line plot, respectively, of the magnetic field distribution from a volume coil with a uniform quadrature drive at 300 MHz.
Figure 8B:
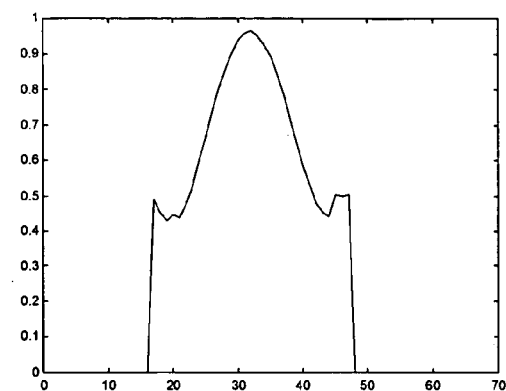

FIGS. 8A and 8B show the excitation field distribution as found with the above-described coil employed in the most homogenous primary mode with quadrature excitation. In this case, the current amplitudes were constant and each element was phase-shifted 45° from adjacent elements such that the phases on each element, in sequence, were 0°, 45°, 90°, 135°, 180°, 225°, 270°, and 315°. Note that there is a marked center brightening, as seen in the line plot in FIG. 7B.

Figure 9A:
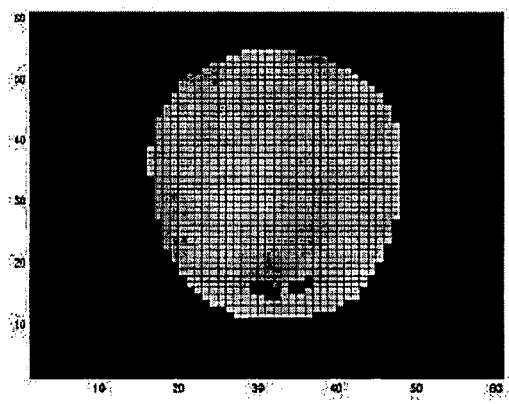
FIGS. 9A and 9B show a prior art image and a line plot, respectively, of an optimized magnetic field distribution from a volume coil with a non-uniform drive designed to produce a maximally uniform field at 300 MHz.
Figure 9B:
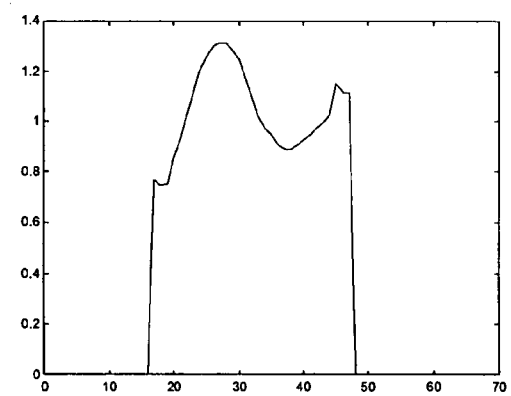

FIGS. 9A and 9B show the excitation field distribution as improved by optimizing the current and phases on each coil element to maximize the excitation uniformity over the human brain. While there is a substantial reduction in excitation non-uniformities, a substantial inhomogeneity in spin excitation remains.

The reduction of the inhomogeneity shown in FIGS. 8 and 9 using a single RF transmission with time varying spatial characteristics or two or more separate RF transmissions of different spatial characteristics is the subject of the present invention.

2. Method I

The first method of the present invention provides spin excitation using a sequence of two or more RF transmissions with different spatial characteristics. Each RF transmission is initiated a discrete time after the termination of the previous RF transmission. That discrete time gap should not be longer than the longest intrinsic relaxation time constant of the system.

For this method, a volume coil of the type described in U.S. Pat. No. 6,501,274 or any volume coil capable of independent drive operation of each coil element is employed. The amplitude and phase of each element are optimized during the first and subsequent RF transmissions to create a spin excitation distribution of the desired uniformity or other characteristic over the region of interest.

Figure 10A:
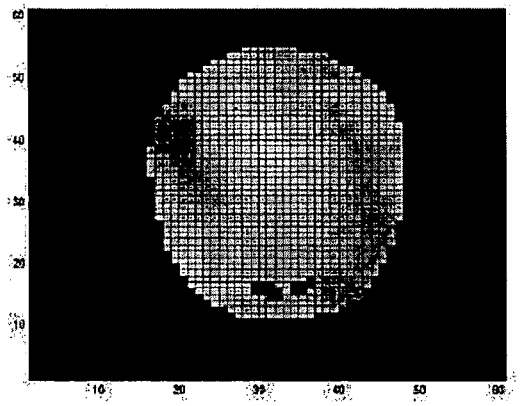
FIGS. 10A and 10B show images of the magnetic field distribution for the first and second RF transmissions, respectively, where both transmissions are optimized for all coil elements in order that the combination results in maximally uniform spin excitation.
Figure 10B:
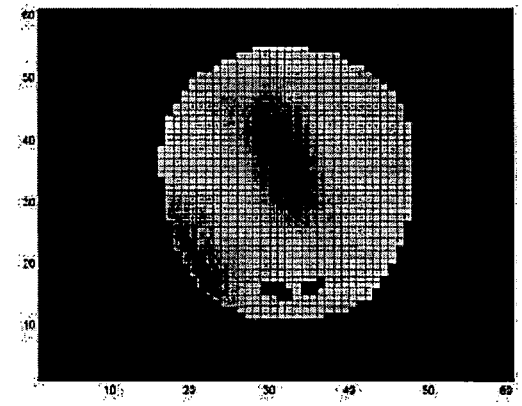
Figure 10C:
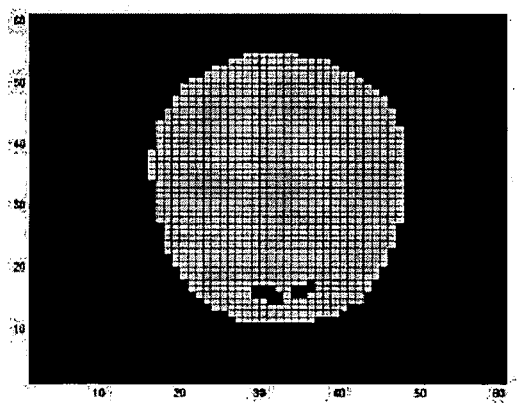
FIGS. 10C and 10D show an image and a line plot, respectively, of the total resultant excitation produced by the field distributions from the first and second RF transmissions of FIGS. 10A and 10B.
Figure 10D:
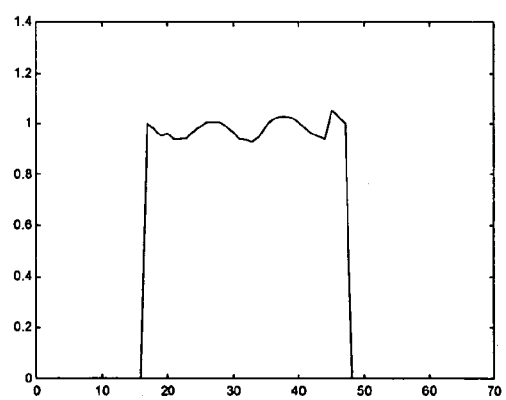

FIGS. 10A–10D show the calculated results of a spin excitation with two separate RF transmissions with different spatial characteristics. In this case, a method of simulated annealing (a simple though robust optimization method) was used to find the optimum amplitude and phase for each element during the first and second RF transmissions. FIGS. 10A and 10B show the individual fields of the first and second RF transmissions, respectively, and FIGS. 10C and 10D show the total spin excitation distribution provided by the combined effects of the two RF transmissions. The result is a more than four-fold reduction in spin excitation inhomogeneity—a much better result than can be achieved by using an RF transmission of the prior art.

The present invention contemplates that three or more RF transmissions of different spatial characteristics can be used to further correct any remaining inhomogeneities or discrepancies from the desired spin distribution. Alternately, by continuously varying the amplitude and phase of the individual coil elements to vary the spatial characteristics of the RF transmission, additional improvements in spin excitation homogeneity can be achieved.

It may not always be convenient to optimize both the first and second RF transmissions. FIGS. 11A–11D show the result of optimization of the amplitude and phase of the second RF transmission only. In this case the second transmission exists only to correct or compensate for the known inhomogeneities in the first. Although the improvement is not as dramatic as when both transmissions are optimized, a large improvement is still seen over the use of an RF transmission of the prior art.

3. Method II

The second method provides spin excitation using a single transmission with continuously varying spatial characteristics. As in Method I, a volume or other conductor arrangement with independently driven elements is used. However, rather than two or more discrete transmissions, the phases and amplitudes of the elements are continuously varied to achieve the desired spatial distribution of the overall spin excitation. This method can produce a more homogeneous excitation field than Method I, though it has a higher (e.g., infinite) number of degrees of freedom.

4. Method III

The third method provides spin excitation using successive transmissions via the primary and higher order modes of a volume coil. This method uses any volume coil that can be driven in either the primary (uniform) or secondary (gradient) mode. This can be achieved with a volume coil that has an independent drive on each element or with a volume coil in which the primary and secondary modes have been tuned to the same frequency. Alternately, switches (e.g. PIN diodes) can be used to tune and detune a conventional volume coil between the primary and secondary modes of operation.

Figure 12A:
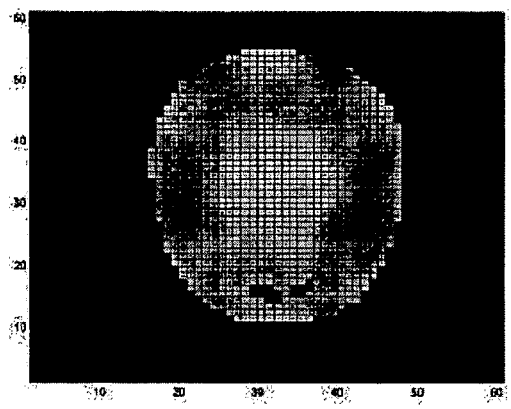
FIGS. 12A and 12B show images of the excitation field distributions for the first and second RF transmissions, respectively, where the first RF transmission occurs using the primary or uniform mode of a volume coil and the second uses the secondary or gradient mode of a volume coil.
Figure 12B:
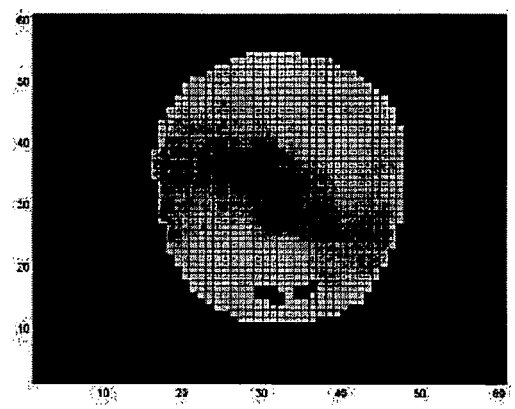
Figure 12C:
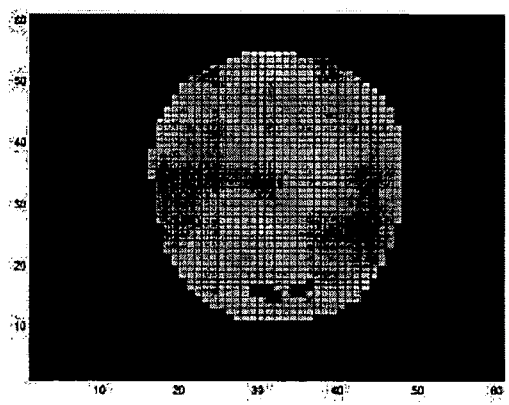
FIGS. 12C and 12D show an image and a line plot, respectively, of the combination of the excitation field distributions from the first and second RF transmissions of FIGS. 12A and 12B, where the relative amplitude of the two transmissions is optimized to provide a maximally uniform spin excitation.
Figure 12D:
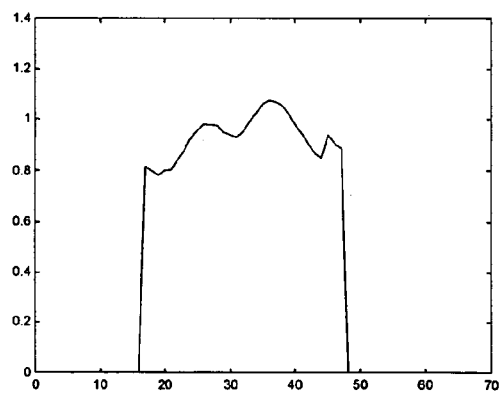

FIGS. 12A–12D show the calculated results of such an arrangement. In this case, a linear optimization method is used to adjust the relative amplitudes of each excitation mode to optimize the overall spin excitation homogeneity. FIG. 12A shows the excitation field during the first RF transmission and FIG. 12B shows the excitation field during the second RF transmission. FIGS. 12C and 12D show the overall excitation field distribution. While the result is not as good as that of Methods I or II, substantial correction of the spin excitation is achieved by changing only one variable. This compares to Method I, where 32 variables need to be adjusted for optimal performance (amplitude and phase on eight elements during the two RF transmissions), and Method II, where 16 variables need to be adjusted continuously for optimal performance (amplitude and phase on eight elements during the second RF transmission only). In practice, it is likely that the adjustment of a single parameter will be easier to achieve and result in acceptable performance.

5. Method IV

With this method, excitation is provided with a volume or surface coil followed by separate excitation with one or more local surface coils. The surface coils, placed close to the head, correct for the reduced excitation amplitudes over the temporal and parietal lobes during the second or later transmissions or provide other highly spatially non-uniform field profiles to locally generate or correct inhomogeneous spin excitation.

6. Comparison of Excitation Methods

Table I compares the results of the various methods for the specific case of a head inside a volume coil of 28 cm inside diameter at 300 MHz. The more parameters (e.g. amplitudes and phases) that are adjusted, the more homogenous the overall spin excitation becomes. However, even with only one adjusted parameter, as in Method III (e.g. the ratio of amplitude of first and second transmissions), homogeneity better than that of optimization of all the amplitudes and phases of during a single pulse of the prior art can be achieved.

TABLE I

| Method | Standard deviation of excitation field amplitudes | Peak Deviation Ratio (max − min)/ average |
| --- | --- | --- |
| FIG. 8: Single RF transmission of the prior art with no correction. | 0.21 | 1.50 |
| FIG. 9: Single RF transmission of the prior art with phase and amplitude correction of each coil element. | 0.14 | 0.88 |
| FIG. 10: Two sequential RF transmissions with phase and amplitude correction of each coil element. | 0.045 | 0.45 |
| FIG. 11: Two sequential RF transmissions with phase and amplitude correction of each coil element during second transmission only. | 0.085 | 0.88 |
| FIG. 12: Optimal combination of transmissions using primary and secondary modes of volume coil. | 0.125 | 1.25 |

In all of the above cases, a series of spin excitations and data receptions may be required to properly adjust the amplitudes (and phases, if applicable) of the transmit coil elements. In a conventional system, this is often done by applying pulses to the transmit coil, measuring the received signal, and adjusting the transmit RF power amplitude to give a received signal of the first maximum (90 degree excitation) or second minimum amplitude (180 degree spin excitation) as the RF power is increased. While this can be done with the methods of the present invention, it may in fact be better to make actual maps of the effective spin excitation and modify the amplitudes (and phases, if applicable) present in the transmit system to achieve the desired spin excitation distribution. In this case, a spin excitation map would need to be measured and an optimization procedure used to modify the transmit variables to result in a closer approximation to the desired distribution. This procedure would then be repeated until the closest approximation to the desired excitation profile is achieved. As this procedure takes longer with more variables to adjust, Method III may, in practice, be the simplest to implement since in this case there is only a single variable to adjust, although the more complex methods generally lead to better results.

It may also be possible to use a fixed combination of parameters (e.g., relative amplitudes and phases of currents in the transmit structure during different transmissions) which have been designed to provided optimum results over the widest range of conditions. This would prevent the need for optimization of a potentially large number of parameters though the results from individual optimization would lead to more uniform spin excitation for a given region and subject. In this case, since the relative values of the transmit parameters are fixed, only the single constant would need to be adjusted to provide a spin excitation of given amplitude, as is the case with a conventional transmit system. Simple ramping of the overall transmit RF amplitudes would allow calibration of the system for a spin excitation of desired amplitude.

There is no requirement that the two or more RF transmissions be separate in time. If the system on which the present invention is implemented permits, for example the system of Method II, the two or more RF transmissions of different spatial characteristics may be temporally contiguous or even partially overlap, consistent with their inducing a spin excitation of desired characteristics.

In most pulse sequences, there is a limited time allowed for spin excitation due to the requirement that other events need to occur which cannot take place during RF transmission. Such events include spin relaxation, certain gradient waveforms, and data acquisition periods. This limits the total length of any given RF transmission or series of transmissions to a fraction of the overall imaging time, and places a limit upon how many RF transmissions of different spatial characteristics can be used for a given spin excitation or how long a continuously varying pulse can last. As most sequences require multiple excitation and data acquisition periods, individual spin excitations must be kept fairly short. Most pulse sequences in current use have total RF transmissions occupying between 1% and 40% of the total imaging time. The more complex transmissions of the present invention would be expected to require a larger fraction of the imaging time but still generally require less than 50% of the total imaging time.

Thus it has been shown and described methods for generating an improved approximation to a spin excitation of desired spatial distribution in an MRI system which satisfy the objects set forth above.

Since certain changes may be made in the present disclosure without departing from the scope of the present invention, it is intended that all matter described in the foregoing specification and shown in the accompanying drawings be interpreted as illustrative and not in a limiting sense.

I claim:

1. A method for inducing spin excitation within an object in a magnetic resonance imaging system that includes a transmit inductor system, said object having one or more intrinsic relaxation time constants, said method comprising the steps of:
   (a) providing said transmit inductor system with the ability to generate a plurality of RF transmissions with different spatial characteristics;
   (b) generating a first RF transmission from said transmit inductor system with first spatial characteristics; and
   (c) prior to expiration of the longest of said intrinsic relaxation time constants, generating a second RF transmission from said transmit inductor system with second spatial characteristics different from said first spatial characteristics;

(d) whereby said spin excitation is induced by the combined effects of said first RF transmission and said second RF transmission.

2. The method of claim 1 wherein there is a time gap between said first RF transmission and said second RF transmission.

3. The method of claim 1 wherein there is no time gap between said first RF transmission and said second RF transmission.

4. The method of claim 1 wherein said first RF transmission is temporally overlapped by said second RF transmission.

5. The method of claim 1 wherein said method further comprises generating additional RF transmissions after said second RF transmission.

6. The method of claim 1 wherein said transmit inductor system is provided with a volume coil having a primary mode and a gradient mode, said first RF transmission being generated by said volume coil in said primary mode and said second RF transmission being generated by said volume coil in said gradient mode.

7. The method of claim 1 wherein said transmit inductor system is provided with a volume coil and at least one surface coil, said first RF transmission being generated by said volume coil and said second RF transmission being generated by said at least one surface coil.

8. The method of claim 1 wherein said transmit inductor system includes a plurality of surface coils, each of said RF transmissions being generated by at least one of said surface coils.

9. The method of claim 1 wherein said first RF transmission transitions to said second RF transmission by continuously varying said spatial characteristics generated by said transmit inductor system.

10. A method for inducing spin excitation within an object in a magnetic resonance imaging system that includes a transmit inductor system, said method comprising the steps of:

(a) providing said transmit inductor system with the ability to generate an RF transmission with continuously time-varying spatial characteristics; and (b) generating an RF transmission from said transmit inductor system with spatial characteristics that change as a function of time;

(c) whereby said spin excitation is induced by the combined effects of said spatial characteristics that change as a function of time.

11. The method of claim 10 wherein said object has one or more intrinsic relaxation time constants and said RF transmission has a duration of not longer than the longest of said intrinsic relaxation time constants.

* * * * *